(12) United States Patent
Jeckeln et al.

(10) Patent No.: US 7,035,345 B2
(45) Date of Patent: Apr. 25, 2006

(54) ADAPTIVE PREDISTORTION DEVICE AND METHOD USING DIGITAL RECEIVER

(75) Inventors: Ernesto G. Jeckeln, Montréal (CA);
Fadhel M. Ghannouchi, Montréal (CA); Mohamad Sawan, Laval (CA);
François Beauregard, La Prairie (CA)

(73) Assignee: Polyvalor S.E.C., Montreal (CA)

( * ) Notice: Subject to any disclaimer, the term of this patent is extended or adjusted under 35 U.S.C. 154(b) by 797 days.

(21) Appl. No.: 09/877,608

(22) Filed: Jun. 8, 2001

(65) Prior Publication Data

US 2002/0191710 A1    Dec. 19, 2002

(51) Int. Cl.
*H04K 1/02* (2006.01)

(52) U.S. Cl. .................. 375/296; 375/295; 375/297; 330/149

(58) Field of Classification Search .............. 375/296, 375/297, 295, 284, 285; 455/46, 114.3, 91; 330/149
See application file for complete search history.

(56) References Cited

U.S. PATENT DOCUMENTS

| 6,246,286 B1 * | 6/2001 | Persson ................ 330/149 |
| 6,677,870 B1 * | 1/2004 | Im et al. ............... 341/110 |
| 6,741,662 B1 * | 5/2004 | Francos et al. ......... 375/297 |
| 6,751,447 B1 * | 6/2004 | Jin et al. ............. 455/114.3 |
| 2001/0014592 A1 * | 8/2001 | Helms ................... 455/91 |

\* cited by examiner

*Primary Examiner*—Shuwang Liu
(74) *Attorney, Agent, or Firm*—Wells St. John P.S.

(57) ABSTRACT

An advanced adaptive baseband/RF predistorting device, which advantageously uses the concept of digital receiver technology into power amplifier (PA) linearization area. The predistorting device performs an instantaneous characterization of the PA using two digital receivers to supply its dynamic AM-AM and AM-PM transfer functions used to synthesize Look-Up Tables (LUT) which implement the complex predistortion function in order to compensate for any non-linearity and memory effects.

11 Claims, 11 Drawing Sheets

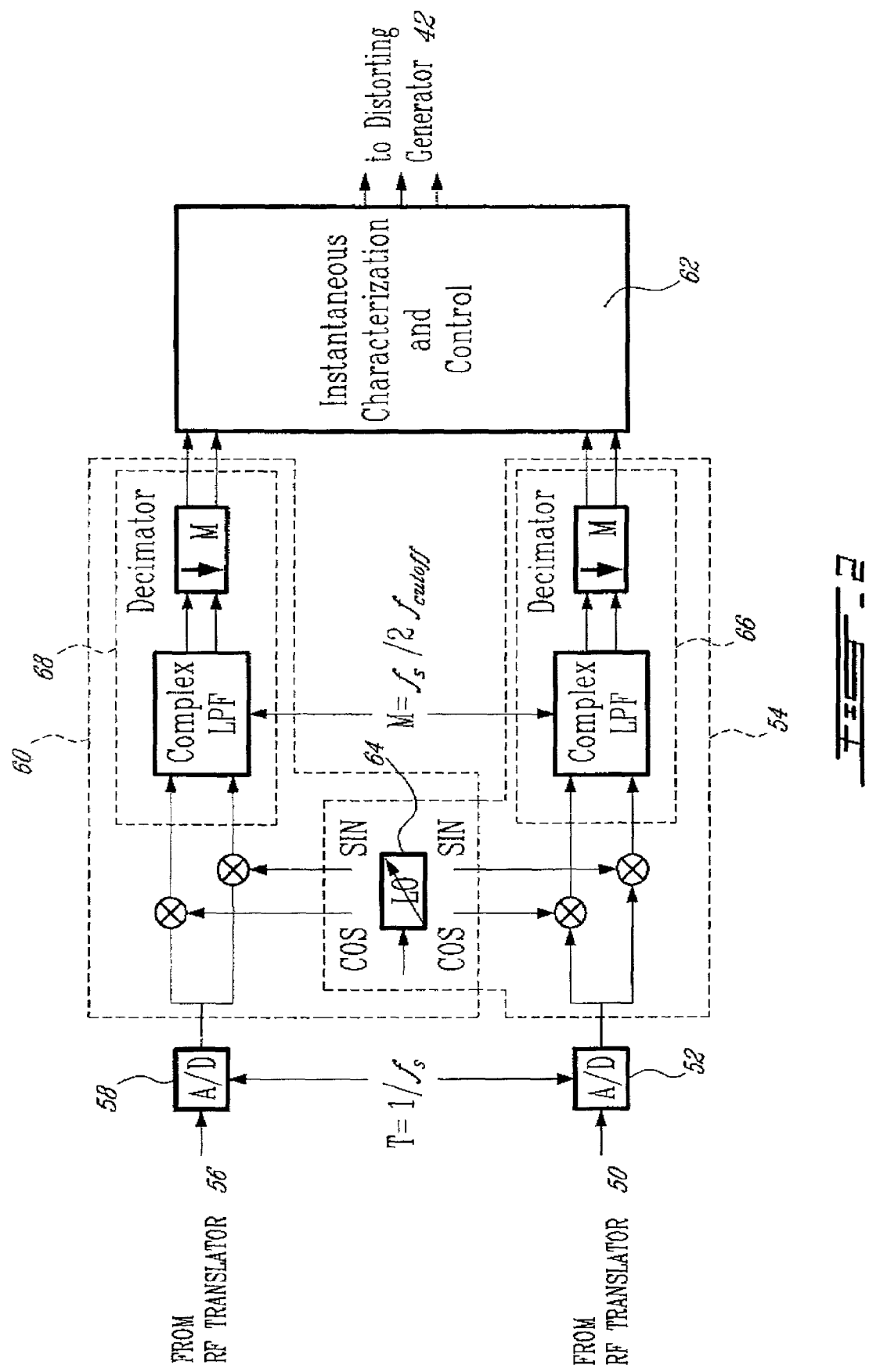

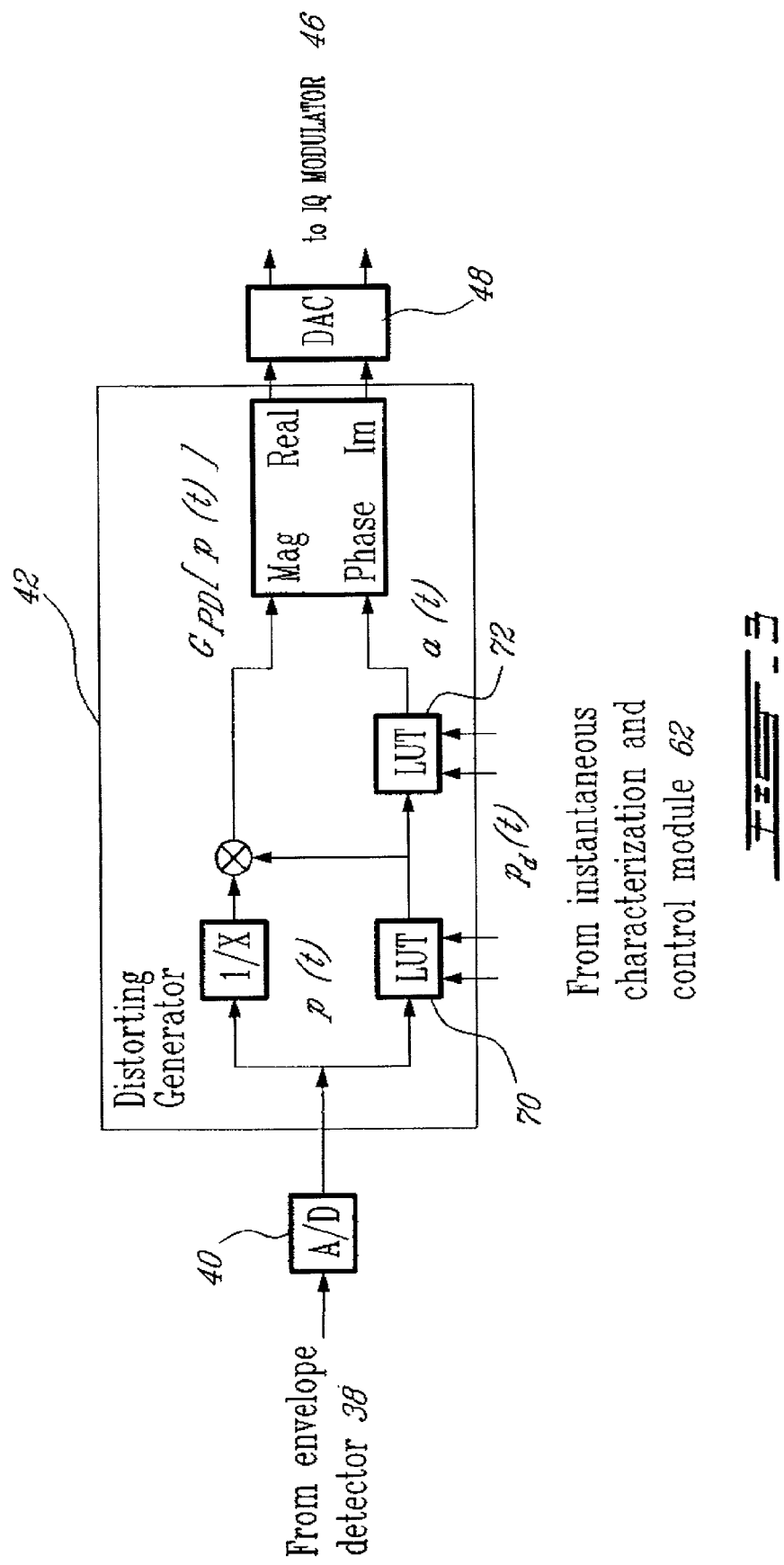

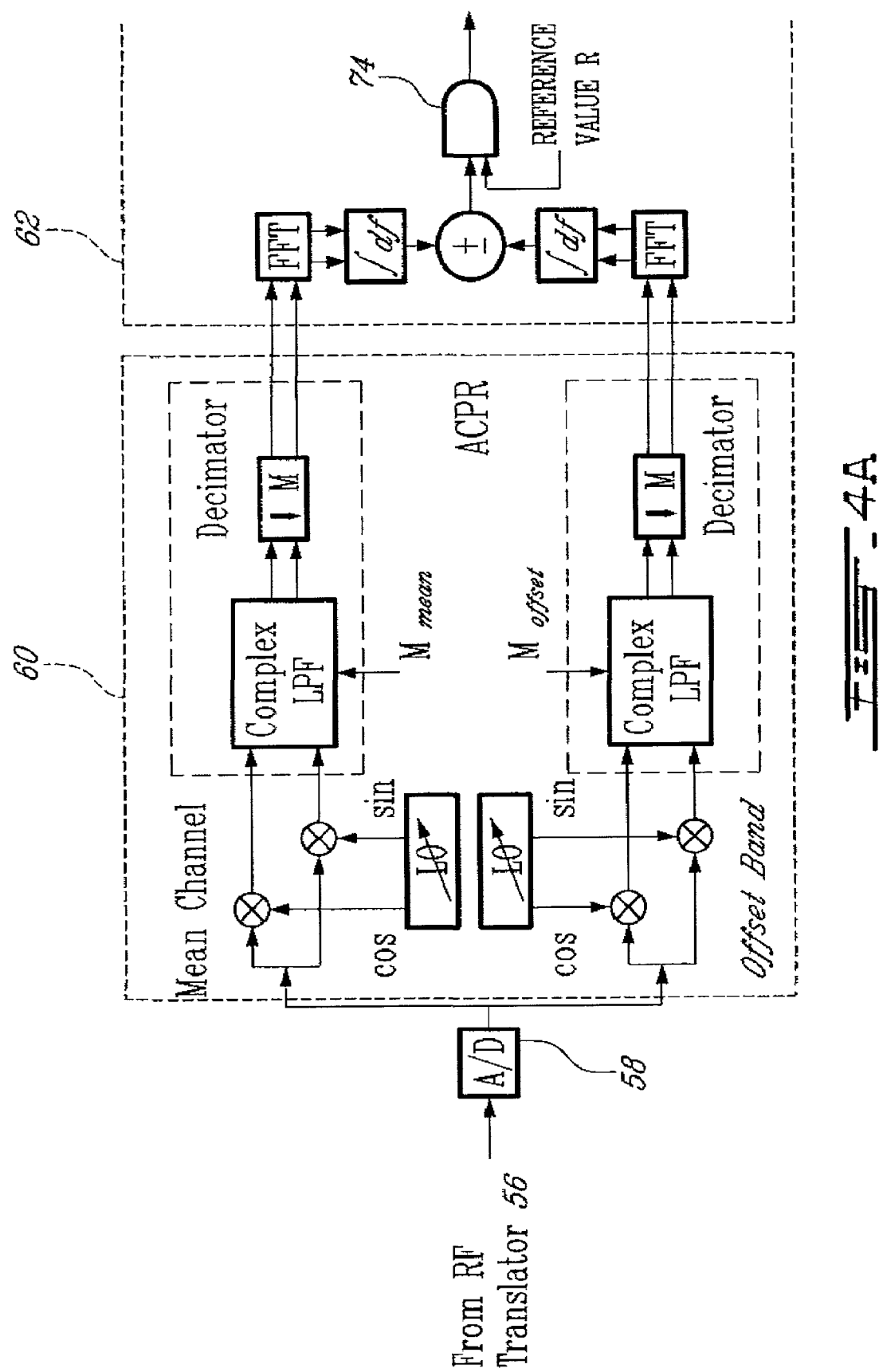

ADAPTIVE PREDISTORTION DEVICE AND METHOD USING DIGITAL RECEIVER

FIELD OF THE INVENTION

The present invention relates to predistorting devices. More specifically, the present invention is concerned with a predistorting device and to a method of predistortion using digital receivers.

BACKGROUND OF THE INVENTION

The demand for developing ultra-linear microwave transmitter, supporting high crest factor signals, increases rapidly, for example by the definition of the third generation (hereinafter "3G") of mobile radio standards.

The demanding adjacent channel power ratio (hereinafter "ACPR") requirements of these systems, i.e., W-CDMA or cdma2000, present a critical issue for transmitter designers if both ultra-linearity and high power efficiency must be met. In fact, the degradation of linearity becomes significant as the power amplifier (hereinafter "PA") operates close to saturation where both high power efficiency and high output power emission are achieved. Therefore, for different stimulus levels driving the amplifiers and for a given ACPR specification, the trade-off between power efficiency and linearity impose an operating point with poor power efficiency. In this case, linearization techniques become the only possible way to recuperate the linearity and to allow optimal trade-off.

Various linearization methods have been reported and are derived, by any measure, from three main types named:

Feed-forward (R. Meyer, R. Eschenbach and W. Edgerley, Jr. "A wide-Band Feedforward Amplifier", IEEE J. of Solid-State Circuits, vol. sc-9, no. 6, pp. 442–428, December 1974), which includes an open loop configuration, can handle a multicarrier signal but can not easily be controlled against the effects of drift. Moreover, their low power efficiency make it suitable in base station only. A good analysis of adaptation behavior has been presented in J. Cavers, "Adaptation Behavior of a Feedforward Amplifier Linearizer", IEEE Transactions on Vehicular Technology, vol. 44, no. 1, pp. 31–40, February 1995;

Feedback (A. Bateman & D. Haines, "Direct Conversion Transceiver Design for Compact Low-Cost Portable Mobile Radio Terminals" IEEE Conf. pp. 57–58, 1989), which presents an excellent reduction of out-of-band emissions, is relatively easy to implement. However, stability requirement limits its bandwidth because of its critical dependence on the loop delay; and Predistortion (N. Imai, T. Nojima and T. Murase, "Novel Linearizer Using Balanced Circulators and Its Application to Multilevel Digital Radio Systems", IEEE Transactions on Microwave Theory and Techniques, vol. 37, no. 8, pp. 1237–1243, August 1989), this technique has historically been the most common method in analog implementation. This method uses a nonlinear element which precedes the device to be compensated, its gain-expansion characteristic cancels the gain compression of the amplifier. Like feed-forward, it has an open loop configuration and therefore is very sensitive to drifts.

The predistortion technique has historically been the most common method in analog implementation. Now, this technique is well suited to digital implementation, for example by integrating a DSP chip to handle high-speed arithmetic. In this way, important experimental results have been presented in the following papers, demonstrating the capability in reducing the spectral spreading and how adaptive correction for drift, aging and temperature variation can be achieved using DSP circuits.

[1] Y. Nagata, "Linear Amplification Technique for Digital Mobil", in Proc. IEEE Veh. Technol. conf., San Francisco, Calif., 1989, pp. 159–164.

[2] M. Faulkner, T. Mattsson and W. Yates, "Adaptive Linearization Using Predistortion" in Proc. 40th IEEE Veh. Technol. Conf. 1990. pp. 35–40.

[3] A. S. Wright and Willem G. Durtled, "Experimental Performance of an Adaptive Digital Linearized Power Amplifiers", IEEE Transactions on Vehicular Technology, vol. 41, no 4, pp. 395–400, November 1992.

[4] J. Cavers, "Amplifier Linearization Using a Digital predistorter with Fast Adaptation and Low Memory Requirement", IEEE Transaction on Vehicular Technology, vol. 39, no 4, pp. 374–382, November 1990.

[5] E. G. Jeckeln, F. M. Ghannouchi and Mohamad Sawan, "Adaptive Digital Predistorter for Power Amplifiers with Real Time Modeling of Memoryless Complex Gains", IEEE MTT-S 1996 International Microwave Symposium, San Francisco, Calif., June 1996.

Although the above-mentioned technique is powerful due to its digital operating principles, it presents certain inflexibility in the sense that; it is suitable only when the baseboard signal is acceded directly before the up-conversion. In most cases, linearizer designers have no access to baseband signal; hence, they found themselves confined to use traditional Radio-frequency (hereinafter "RF") analog predistortion techniques. In this case, it is more difficult to meet severe ACPR for a high crest factor's signals specifications while operating not in far back-off regions.

The RF-based predistorter proposed by Stapelton et al. (S. P. Stapelton and F. C. Cotescu, "An Adaptative Predistorter for a Power Amplifier Based on Adjacent Channel Emissions", IEEE Transactions of Vehicular Technology, vol. 41, no 1, pp 49–56, February 1992) offers an interesting alternative. It includes a complex gain tuning circuit that controls the amplitude and phase of the RF signal. The baseband environment is confined to optimize two nonlinear work functions by monitoring the ACP-minimization (Adjacent Channel Power) measured by a power detector. Drawbacks of this method are its slow convergence toward the minimum and its sensitivity to the measurement noise.

OBJECTS OF THE INVENTION

An object of the present invention is therefore to provide an improved predistortion device and method.

SUMMARY OF THE INVENTION

More specifically, in accordance with the present invention, there is provided an adaptive method for predistorting an RF modulated signal, to be transmitted, supplied by a signal source to an input of a power amplifier having an output for delivering an amplified output signal, said method comprising the steps of:

predistorting the RF modulated signal to be transmitted using an I/Q modulator interposed between the signal source and the input of the power amplifier, and controlled by means of amplitude and phase look-up tables stored in a distorting generator;

producing, via a first digital receiver, a first feedback signal in response to the RF predistorted signal;

producing, via a second digital receiver, a second feedback signal in response to the RF amplified output signal from the power amplifier;

modeling the power amplifier in response to the first and second feedback signals; and updating the predistortion amplitude and phase look-up tables in response to said modeling of the power amplifier.

According to a second aspect of the present invention, there is provided an adaptive device for predistorting an RF modulated signal to be transmitted, supplied by a signal source to an input of a power amplifier having an output for delivering an amplified output signal, said adaptive device comprising:

an I/Q modulator interposed between the signal source and the input of the power amplifier;

a distorting generator including predistortion amplitude and phase look-up tables; said distorting generator controlling said I/Q modulator to predistort the RF modulated signal to be transmitted in amplitude and in phase;

a first digital receiver producing a first feedback signal in response to the RF predistorted signal from said I/Q modulator;

a second digital receiver producing a second feedback signal in response to the RF amplified output signal from the power amplifier; and a control module receiving said first and second feedback signals from said first and second digital receivers; said control module being so configured as to model the power amplifier in response to the first and second feedback signals and to update said amplitude and phase look-up tables of said distorting generator in response to a dynamic modeling of the power amplifier.

According to a third aspect of the present invention, there is provided a transmitter system for up-converting and amplifying a baseband signal from a signal source; said transmitter system comprising:

a power amplifier having a signal input and an amplified signal output;

an I/Q modulator interposed between the baseband signal source and said signal input;

a distorting generator including predistortion amplitude and phase look-up table tables; said distorting generator controlling said I/Q modulator to predistort the baseband signal in amplitude and in phase;

an up-converter receiving the predistorted baseband signal; said up-converter being so configured as to supply an up-converted predistorted signal to said signal input of said power amplifier;

a digital receiver producing a feedback signal in response to the up-converted amplified output signal from said amplified signal output; and a control module receiving a delayed reference signal from said I/Q modulator and the feedback signal from said digital receiver; said control module being so configured as to model the transmitter system in response to the reference and feedback signals and to update said amplitude and phase look-up tables of said distorting generator in response to a dynamic non linearity and memory effect modeling of the transmitter system.

According to a final aspect of the present invention, there is provided an adaptive device for predistorting a baseband digital signal to be transmitted, supplied by a signal source to an input of a transmitter system having an output for delivering an amplified output signal, comprising:

predistorter means comprising an I/Q modulator controlled by predistortion amplitude and phase look-up tables means interposed between the signal source and the input of an up-converter for amplitude and phase predistorting the signal to be transmitted;

digital receiver means for producing a feedback signal in response to the amplified output signal from the transmitter system; and means for modeling the transmitter system in response to a reference signal and to the feedback signal and to update the amplitude and phase look-up tables in response to a dynamic non-linearity and memory effect modeling of the transmitter system.

Other objects, advantages and features of the present invention will become more apparent upon reading of the following non-restrictive description of preferred embodiments thereof, given by way of example only with reference to the accompanying drawings.

BRIEF DESCRIPTION OF THE DRAWINGS

In the Appended Drawings:

FIG. 2 is a block diagram illustrating the algorithm the PA characterization made via the digital receivers of the predistortion device of FIG. 1;

FIG. 3 is a block diagram of the distorting generator of the predistortion device of FIG. 1;

FIG. 4A is a block diagram illustrating the algorithm to process the ACPR for the PA output signal;

DESCRIPTION OF THE PREFERRED EMBODIMENT

Generally stated, the present invention relates to an adaptive baseband/RF predistorting device, which advantageously integrates the concept of digital receiver technology into the linearization techniques, and to a method therefor. By taking advantage of the digital receiver technology to digitally translate signal from RF to baseband with very high accuracy, the predistorting device of the present invention performs the instantaneous characterization of the memoryless nonlinearity in baseband to supply a correlated predistortion function. The distortion is generated in baseband by addressing the extracted predistortion function and then, the distortion is embedded into the RF signal by dynamically adjusting the amplitude and the phase of the carrier.

Figure 1:
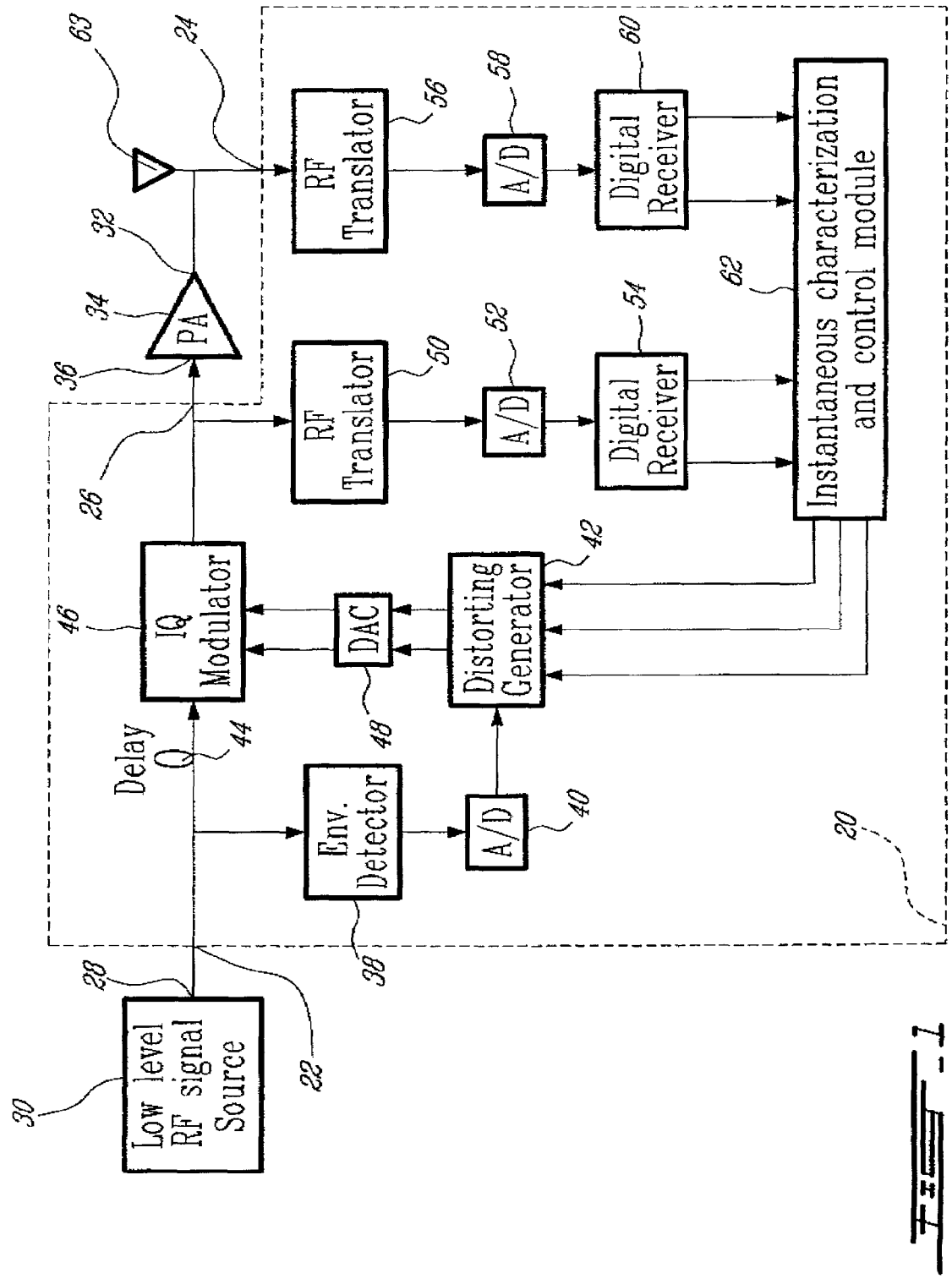
FIG. 1 is a general block diagram of a predistortion device according to a first embodiment of the present invention.

Turning now to FIG. 1 of the appended drawings, a predistorting device 20 according to a first embodiment of the present invention will be described. The predistorting device 20 has two inputs 22 and 24 and an output 26. The first input 22 is connected to the low level RF output 28 of a low level RF signal source 30 to thereby receive an input RF signal therefrom; and the second input 24 is connected to the RF output 32 of a PA 34. The RF output 32 delivering an amplified output RF signal. The output 26, on the other hand, is connected to the input 36 of the PA 34.

The RF signal from the first input 22 goes through an envelope detector 38 to provide the envelope variation thereof. This envelope is digitized by an analog to digital converter (hereinafter "A/D") 40. The digitized envelope is used to index a distorting generator 42 as will be described hereinbelow.

The RF signal from the first input 22 also goes through a delay line 44 and then in an Quadrature modulator 46 (hereinafter referred to as an "IQ modulator") that is used as a complex gain adjuster that controls the amplitude and the phase of the RF input signal. The complex gain levels applied to the RF input signal are determined by the distorting generator 42 via a digital to analog converter (hereinafter "DAC") 48.

Basically, the distorting generator 42 includes a lookup table for both the amplitude and the phase that are indexed by the output of the A/D converter 40 to supply the correction factor both for the amplitude and for the phase of the RF input signal to simulate a linear amplification curve of the PA 34 when the distorted RF signal is supplied to the input 36 of the PA 34.

To determine the distortion applied to the signal by the PA 34, the amplitude and phase of the signal supplied to its input 36 and the corresponding amplitude and phase of the amplified signal from its output 32 are compared.

To achieve this, the PA input signal is supplied to a RF translator 50 that translates the signal down to within an alias-free sampling range from DC up to 35 MHz. After this translation stage, the signal is conditioned by an A/D converter 52 into digital samples at a high rate. For example, it has been found that a 12-bit A/D converter operating at the sampling rate of 70 MHz is adequate.

The digital samples from the A/D converter 52 are supplied to a digital receiver 54. The entire subsequence complex down converting, filtering and decimating is performed digitally by the digital receivers 54.

The signal of the output 32 of the PA 34 follows a similar route via a RF translator 56, an A/D converter 58 and a digital receiver 60.

Figure 4B:
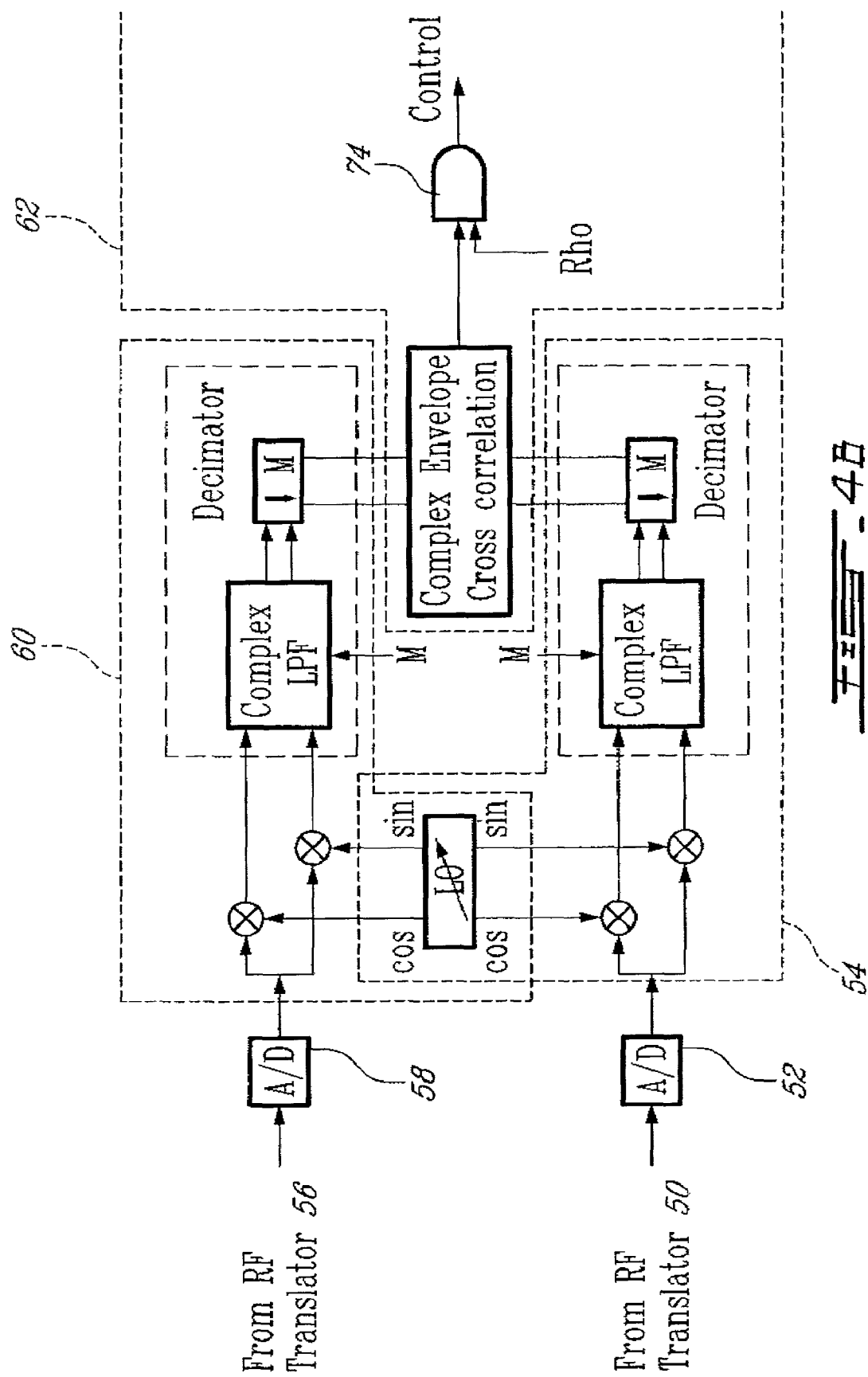
FIG. 4B is a block diagram similar to FIG. 4A illustrating an alternate algorithm to process the distortion evaluation for the PA output signal, by using a complex envelope cross correlation function.

It is understood that, the complex envelope from the output 32 of the PA 34 brings the information of non-linearity when it is driven further into nonlinear operation mode. This non-linearity information can be discriminated when this complex envelope is referenced to the complex envelope from the input 36 of the PA 34. Therefore, the instantaneous characterization (i.e., AM-AM and AM-PM curves) can be performed following both complex envelopes variation during a real work condition. It allows an instantaneous characterization and control module 62, which is supplied with a first feedback signal in the form of both curves from the digital receiver 54 and a second feedback signal in the form of both curves from the digital receiver 60; to correlate the predistortion function of the PA 34 in real time. As will be further described hereinbelow with reference to FIGS. 4A and 4B, when necessary, the instantaneous characterization and control module 62 updates the amplitude and phase lookup tables of the distorting generator 42 to ensure that the IQ modulator 46 correctly distort the RF signal so that the amplified signal supplied to the antenna 63 corresponds to the low level RF signal entering the input 22 of the predistorting device 20. Of course, as will easily be understood by one skilled in the art, the instantaneous characterization and control module 62 applies an adequate delay between the curves supplied by the digital receiver 54 and the digital receiver 60 to compensate for the delay introduced by the PA 34. This delay may be determined by a cross-correlation function.

Instantaneous Characterization Algorithms

In terms of algorithms, the translation and filtering process are the two major signals processing operations performed by the digital receivers 54 and 60.

First, a single-sideband complex translation is accomplished by mixing the real signal with the complex output of a digital quadrature local oscillator 64 (hereinafter "LO"), as shown in FIG. 2. It is to be noted that even though a single LO 64 is shown in FIG. 2, a different local oscillator could be used for each digital receiver.

Then, decimators, under the form of decimation filters 66 and 68, condition the complex baseband signal by fixing an appropriate value of the decimation parameter M. This parameter controls the reduction of the cutoff frequency $f_{cutoff}$ and the sampling rate $f_s$, as follows:

$$f_{cutoff} = f_s/2M \quad (1)$$

$$f' = f_s/M \quad (2)$$

Where f' is the reduced sampling rate under the effect of the decimation parameter. In a multi rate system there are two or more sampling rate that are related by the parameters $M_1, M_2 \ldots M_n$]

Therefore, by tuning the digital frequency of the LO 64 and the M value, any signal can be selected digitally from the RF domain and put it into the baseband domain for further processing by the instantaneous characterization and control module 62.

In this way, the two digital receiver output data, that represent the stimulus and response of the PA 34, are routed through the instantaneous characterization and control module 62 to carry out the nonlinearity behavioral analysis.

At this point, the required sample frequency to capture the $n^h$ order intermod products of both signals is advantageously taken into consideration. Following the Nyquist criterion, the required sample frequency for a signal of RF bandwidth BW is given by:

$$f' = n \cdot BW \quad (3)$$

Note that the sampling rate for the real signal is twice that of the complex signal. Using the equation (2) and fixing the sampling frequency $f_s$, the decimator parameter M can be calculated by:

$$M = \frac{f_s}{n \cdot BW}. \quad (4)$$

In order to characterize the PA 34 through its input and output signals, we can assume that the PA input bandpass signal is given by:

$$v_i(t) = Re\{\rho(t)e^{j\{\omega_c t + \theta(t)\}}\} \quad (5)$$

where $\omega_c$ is the midband angular frequency, $\rho(t)$ is the amplitude variation and $\theta(t)$ is the phase variation. Then, the PA output bandpass signal can be represented by $$v_{out}(t) = Re\{g[\rho(t)]e^{j\{\omega_c t + \phi[\rho(t)] + \theta(t)\}}\} \quad (6)$$

where $g[\rho(t)]$ and $\phi[\rho(t)]$ are two memoryless nonlinear functions that represent the instantaneous AM-AM and AM-PM curves.

Note that these functions are characterized in terms of the input and output bandpass complex envelopes, without including all harmonics effect, Additionally, it is understood that both bandpass complex envelopes are oversampled at the rate of f'. Following the processing path, the optimal compensator is correlated straightforward as follows:

$$\rho_d(t) = g^{-1}[\rho(t)] \quad (7)$$

$$\alpha(t) = -\phi\{g^{-1}[\rho(t)]\} \quad (8)$$

where, the complex envelope gain function of the predistorting device can be written as:

$$G_{PD}[\rho(t)] = \frac{\rho_d(t)}{\rho(t)} e^{j\alpha(t)} \quad (9)$$

Basically, the time domain functions of equation 7 and 8, characterize the amplitude predistortion transfer $g^{-1}$ and the phase predistortion conversion $\phi$ in function of the input amplitude variation and the distorted amplitude variation respectively.

These functions are implemented in the distorting generator 42 through a mapping process using look up table technique as shown in FIG. 3. The mapping process is performed from the input to the output using linear interpolation and according to the number of complex sampled pairs acquired from the instantaneous characterization and control module 62.

It is to be noted that the tables 70 and 72 are configured in polar representation and they are accessed in cascade form at a sampling rate f' adequate to generate the highest order distortion of interest (see E. G. Jeckeln, F. M. Ghannouchi and M. Sawan, "Non Iterative Adaptative Digital Predistortion Technique for Power Amplifiers Linearization", U.S. Pat. No 6,072,364, Jun. 6, 2000). The complex converter block accomplishes the reconstruction of the complex distortion gain and converts it into the Cartesian I/Q waveform.

As can be seen in FIG. 4A, in order to control the adaptation step, the system uses Adjacent Channel Power Ratio (hereinafter "ACPR") as figure of merit. In this way, taking advantage of the decimation process to perform a dramatic reduction in the signal bandwidth, the ACPR is monitored in different range of frequency by processing simultaneous real time FFT spectra. This is accomplished, once the characterization process (FIG. 2) is finished, by dynamically tuning both the LO frequency and the M value of the digital receivers as shown in FIG. 4. More specifically, the digital receiver includes a first channel tuned to the mean frequency and a second channel that is tuned to a predetermined offset frequency, The ACPR measurement includes comparing the average power at the mean channel and at the predetermined offset channel via a comparator 70 that starts the adaptation step when the measured ACPR overflow the reference value R. Notice that the system needs so many digital receiver channels as offset channel to be simultaneously monitored.

In other words, the systems calculates the ACPR between the mean channel and the different offset channels specified by the standard and, when the power at the offset channel is too high, the characterization process of the PA is done again and the look-up tables of the distorting generator are updated. In order to control the adaptation step, the system therefore uses the distortion level at the output signal as a quantifier of the transmitter performance Turning now briefly to FIG. 4B of the appended drawings, another way of determining if the tables have to be updated will be presented. A cross correlation between the corrected output signal and the reference signal from branch is done. This cross correlation accounts for all distortion mechanisms between the two signals and therefore, it gives a measure of the distortion compensation level. In other words, if some of the transmitted energy does not correlate between the two signals, the uncorrelated power appears as added distortion, which amount is compared with an acceptable distortion level. A comparator C starts the adaptation step when the distortion level overflows the reference value Rho. In this way, the whole computation load is reduced more than half in comparison to the FFT algorithm process.

In all cases, signals are captured in time domain and converted to the frequency domain by applying FFT algorithm. In this process, the control of trade-off between leakage and loss of frequency resolution is performed by windowing a finite number of signal samples x(n) by Hanning window function w(n) as follow:

$$x_w(n) = x(n)w(n), \quad 0 \leq n \leq L-1 \quad (10)$$

where L is the window length that represent the quantity of captured signal samples. The real time FFT spectra is governed by the required sample rate f' in each channel and the required frequency resolution $\Delta f$ that are related by the number of sample points N as:

$$N = \frac{f'}{\Delta f} \quad (11)$$

In other words, N is the FFT length and it is used to control the density of equally spaced frequency-sampling points represented by:

$$f_k = \frac{k}{N}, \quad 0 \leq k \leq N-1 \quad (12)$$

where k is an integer, thus, the frequency domain is determined via the following expression using FFT algorithms:

$$X(k) = \sum_{0}^{L-1} x_w(n) e^{-j\frac{2\pi}{N}kn} \quad 0 \leq k \leq N-1 \quad (13)$$

and the total power in a specified channel is computed by:

$$P_{channel}(\text{dBm}) = 10\log\left[\left(\frac{NBW}{BW_{Noise}}\right)\left(\frac{C}{N}\right)\sum_{k=0}^{N-1}|X(k)|^2\right] \quad (14)$$

where c is a factor that considers the 1 mW reference power and the independance condition, NBW is the normalization bandwidth and $BW_{noise}$ is the noise equivalent bandwidth. The ACPR is performed between in-band and out-of-band power spectral densities at specified offset channels as follow:

$$ACPR(dB) = P_{offset}(dB) - P_{mean}(dB) \quad (15)$$

EVALUATION CONDITION

Stimulus Conditions

In order to evaluate the performance, the system is exposed under different stimulus conditions that allow it to be characterized in term of efficiency and distortion. In this way, CDMA, W-CDMA and cdma2000 standard signals are implemented under simulation to apply different stress level characterized by theirs complementary cumulative distribution function (hereinafter "CCDF").

Figure 5:
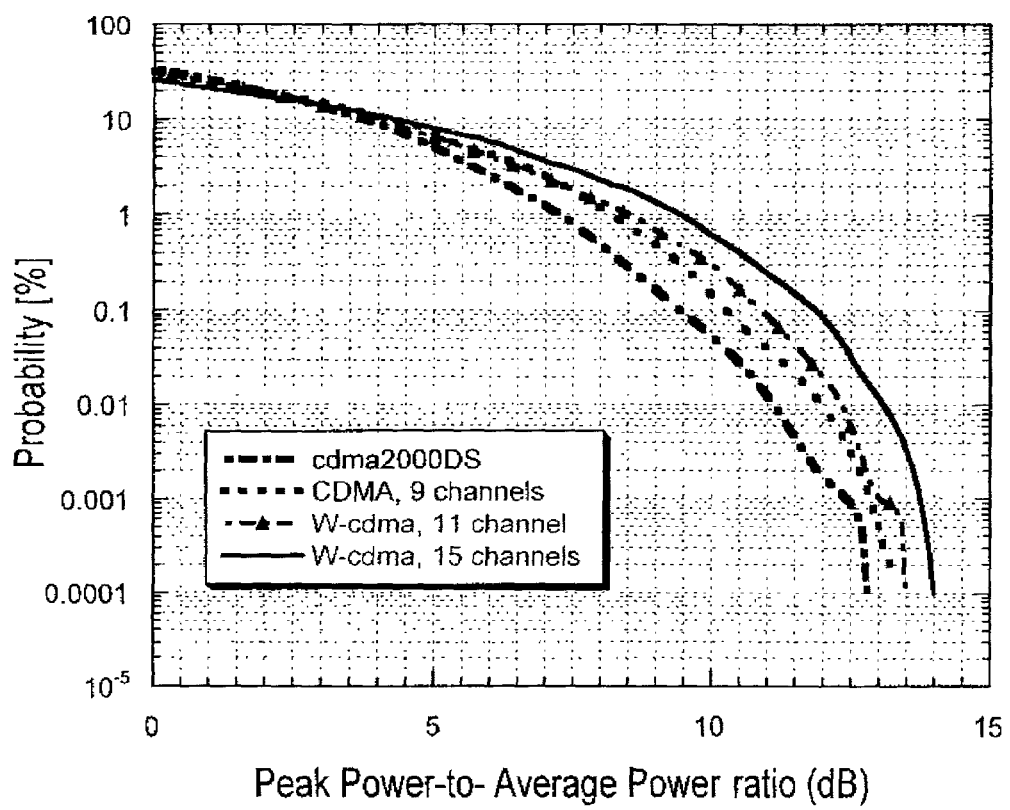
FIG. 5 is a graphic illustrating CCDF plots of different CDMA signals.

As known, these standards signal exhibit different levels of the instantaneous signal amplitudes representing a widely varying envelope that drives the system following a random property. Usually, a set of these level values are referenced to the root-mean-square (hereinafter "RMS") value of the signal giving a set of peak voltage-to-RMS voltage ratio values that allows characterizing a time waveform into the statistical domain, This capability is represented by the CCDF function and it becomes a common tool to represent the stress degree that a stimulating signal can place on nonlinear system. In this function, the ratio values are also referred as peak power-to-average power ratio and the highest ratio value, called crest factor (hereinafter "CF"), give a measure of the dynamic range of the signal. In FIG. 5 we can see the CCDF curves showing the statistical property of each standard signals built in simulation; in all cases, the simulator generates around 800,000 signal samples that allow attaining the 0.0001% probability value with high stability.

In the case of the CDMA signal, the statistical property reveals a peak-to-average ratio of 10.29 dB for a 0.1% of probability and the CF is 13.28 dB. This signal is simulated using a typical Walsh-code channels configuration, i.e., pilot, sync, paging, 8, 16, 24, 40, 48 and 56, and it is among the most stressful signal that satisfies the nine channel requirements of IS-97. For the W-CDMA signal, two different channel configurations including 11 and 15 code channels are simulated; the chip rate is 3.84 MHz and the shaping filter is a root cosine with a roll-off of 0.22 and using Hanning as window function. In the case of the cdma2000, the simulation is performed using a direct spread (hereinafter "DS") as air interface with a single 3.75 MHz-wide carrier and with a spreading rate of 3.6864 Mcps; the filter is three times wider than the CDMA case and the window function is Hanning. Under these simulation conditions, a comparison of the statistical properties represented by the CCDFs in FIG. 5 reveals that for a given probability, i.e. 0.1%, each signal presents different peak factor. Therefore, each signal will drive the nonlinear system further into saturation having a different impact in terms of distortion and efficiency. It points out the effect that as the curves move further to the right, the peak-to-average value becomes higher, which makes the signals more stressful. Consequently, for an acceptable amount of distortion according to the spectrum emission mask, as the signal become more stressful the system will be conditioned to operate in higher back off with the corresponding worsening of the power efficiency. This kind of evaluation allows characterizing the system in term of efficiency and distortion and also predicting the system performance under different work conditions.

Clipping Effect and Soft Limiter

It is believed well known that a class AB power amplifier presents different types of distortion sources and not all of them can be compensated by predistortion. While distortion from the nonlinearity near both the crossover point and the saturation point can be compensated by fitting numerically a correlative predistortion function, distortion from clipping effect escapes from the cancellation capability of the predistortion technique. This limitation represents a drawback of this technique.

In order to estimate this kind of limitation and to predict the highest theoretical performance that can be reached by the predistorting device of the present invention, the performance of a soft limiter is analyzed for all stimulus condition. As known, in an ideal limiter, the phase conversion is constant over the range of the input signal and the output voltage follows exactly the input voltage up to a certain value. Above this value, the output voltage remains constant when the input voltage is further increased. Under this condition, it is evident that as the probability of instantaneous clipped peak values increases, distortion from clipping effect will increase. Consequently, this phenomenon places a rigorous limitation in the system operation point with a direct impact in the power efficiency. Again, we point out that signals having high crest factor will impose an operating point beyond a region of poor power efficiency. Backing-off the operating point will prevent that the distortion masked by the clipping effect overflow the standard requirement. Notice that the characteristic of an ideal limiter represents a perfect linearized class A power amplifier and therefore, its performance places an important reference to the degree of improvement given by a predistortion linearizer.

ACPR

For analysis purpose, the ACPR is evaluated for different operating point by computing the ratio between the in-band and the out-of-band power spectral densities at specified offset channels. In the case of the CDMA, the ACPR is evaluated in three pairs of offset channels that are normalized to the same bandwidths of 30 kHz at the offset frequencies of ±885 kHz, ±1.256 MHz, and ±2.75 MHz. The normalization factor (hereinafter "NF") is calculated by logging, the ratio between the normalization bandwidth NBW, i.e., 30 kHz, and the specified bandwidth BW, as follow:

$$NF(\text{dB}) = 10\log\left(\frac{NBW}{BW}\right) \quad (16)$$

By applying this equation to the J-STD-008 standard requirements that states that the power emissions limitation must be at least −45 dBc/30 kHz, −13 dBm/12.5 kHz and −13 dBm/1 MHz for the first second and third offset channels respectability, the NF values are: −16.2 dB=10 log(30 kHz/1.25 MHz), 3.8 dB=10 log(30 kHz/12.5 kHz) and −15.2 dB=10 log(30 kHz/1 MHz). The normalized limit values of the standard requirement become −28 dB/30 kHz, −9.2 dBm/30 kHz and −28.2 dBm/30 kHz, and the relative limit values of the power spectral densities for the three offsets are given by:

$$R_1(dB)=28.8 \text{ dB} \qquad (17)$$

$$R_2(dB)=28.8 \text{ dB}+\Delta dB \qquad (18)$$

$$R_3(db)=47.8 \text{ dB}+\Delta dB \qquad (19)$$

where Δ is given by:

$$\Delta = \begin{cases} P_{PA}(\text{dBm}) - 35.8 \text{ dBm} & \text{for } P_{PA} \leq 35.8 \text{ dBm} \\ 0 & \text{elsewhere} \end{cases}$$

Figure 6:
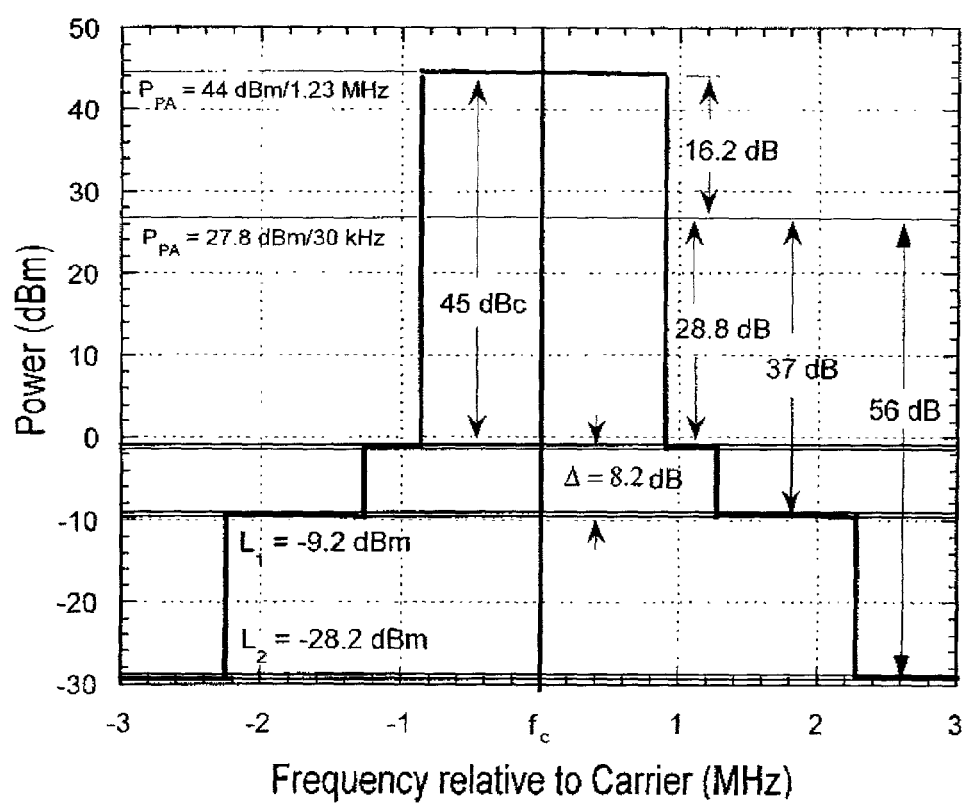
FIG. 6 is a graphic illustrating the 30 kHz normalized requirement for 44 dBm PA.

In FIG. 6 we can see a graphical representation of requirement for a typical 44 dBm PA; after normalization, the mean power gbecome 27.8 dBm/30 kHz, Δ take the value 8.2 dB and the relative limit values are $R_1$=28.8 dB, $R_2$=37 dB and $R_3$=56 dB. Notice that the dBc unit is used when the total power contained in the mean channel is given as reference.

In the case of cdma2000 with DS as air interface, we assume the similar methodology that is applied in the CDMA case (see "performing cdma2000 measurements today", Application Note 1325, HEWLETT PACKARD). The frequency centers of the offset channel are 2.65 MHz, 3.75 MHz, and 5.94 MHz. For W-CDMA standard, the ACPR is evaluated over 3.84 MHz bandwidth at the offset frequency of 5 MHz and the limited emission power is considered at −55 dBc. For all cases, the spectrum analysis is accomplished by converting the time domain signal to frequency domain using Hanning window and with FFT length of 8192 points. The integration bandwidth (IBW) method is used to calculate both mean channel power and offset channel powers and it is performed by applying equation (14). In addition, the simulator computes an average power for each specified integration channel bandwidth and over a specified number of data acquisitions avr=16.

RESULTS AND DISCUSSIONS

The entire system is RF/DSP co-simulated using HP-ADS software for a typical 44-dBm class AB Power Amplifier. Temperature noise, quantization noise, and impairment from other components such as amplitude and phase imbalance of I/Q modulator have been taken into consideration to realistically model the system. The A/D and DAC converters are simulated having 12-bits and 14 bits resolution respectively at the high rate of 70 MHz. The digital receivers are considered as both narrowband and wideband where the M values are ranged from 2 to $2^{17}$.

Simulations are performed applying the set of stimulus mentioned hereinabove in the section entitled "stimulus conditions" on the ideal limiter, on the PA and on the PA including the linearizer. Each simulation is repeated for different operating points to allow characterizing the performance in term of distortion and power efficiency. The Output Back-Off (hereinafter "OBO") referenced to Single Carrier (hereinafter "SC") saturation that represent in any measure the power efficiency, the peak power-to-average power characterized by the CCDF, the word-length of bits and the ACPR are chosen as important factors to analyze the performance for the three cases. FIGS. 7 to 10 detail the simulated results of ACPR versus OBO corresponding for the offset bands above the mean signal frequency. In all cases, the horizontal lines indicate the system specifications for ACPR where the minimum acceptable OBO are illustrated. At this point, it is important to mention that any change on the parameters values and conditions established hereinabove in the section entitled "stimulus conditions", such as roll-off, average number, window function, filters, etc., will have a direct effect on the results.

Figure 7:
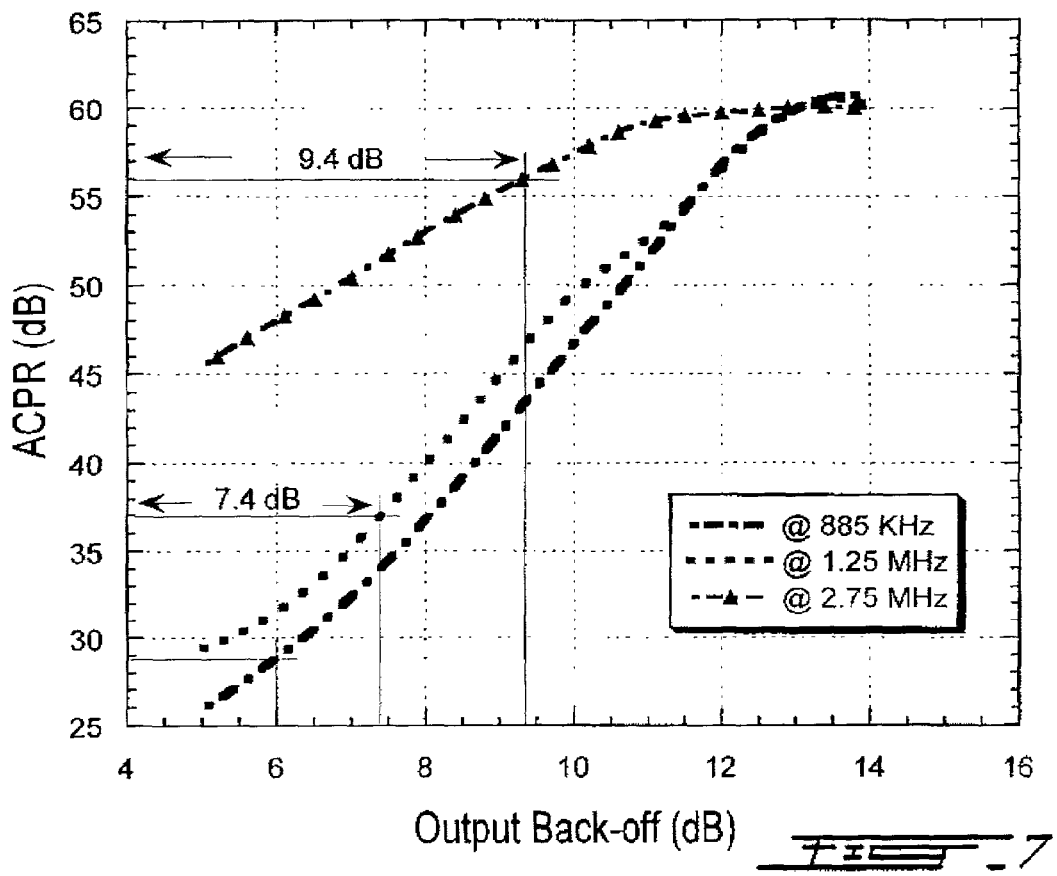
FIG. 7 is a graphic illustrating a simulation of ACPR vs OBO of the ideal limiter under the stimulus of nine channels CDMA standard signal.

FIG. 7 shows the effect of the CDMA signal on the ACPR of the ideal limiter; the simulation is based on 44-dBm-output power. In the three plots, corresponding to the three offset channels, we can see that the minimum acceptable OBO are 6 dB at 885 kHz, 7.4 dB at 1.25 MHz and 9.4 dB at 2.75 MHz; according to the specifications, the results reveal that the ideal limiter cannot be operated with an OBO smaller than 9.4 dB.

Figure 8:
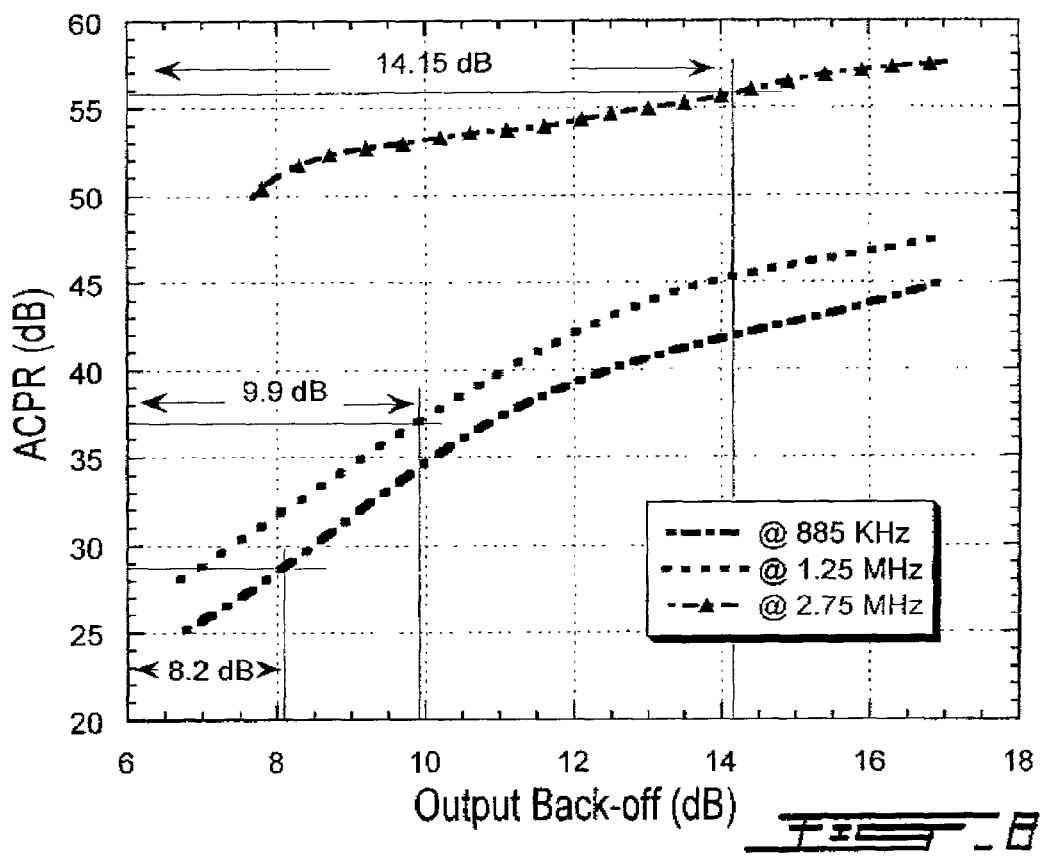
FIG. 8 is a graphic illustrating a simulation of ACPR vs OBO of a 40 dBm PA under the stimulus of a W-CDMA standard signal.

In FIG. 8, the ideal limiter is simulated under the stimulus of cdma2000 signal; in this case, the minimum acceptable OBO are 5.25 dB at 2.65 MHz, 6.8 dB at 3.75 MHz and 9.4 dB at 5.94 MHz. Like CDMA signal case, the third offset channel limits the operating point at least 9.4 dB of OBO. From a comparison, we can notice that although the CDMA signal is shown to be most stressful than the cdma2000 signal, what it is justified in the first and the second offset channels, both case show the same minimum acceptable OBO. From this analysis, the clipping effect seems to be dominant on both first and second channel and with a slight effect on the third channel. It is foreseeable because the AM-PM conversion factor, that has a significant effect in generating higher order of intermodulation, is considered constant over the range of the input signal. Additionally, in both cases, the third offset channel governs the minimum acceptable OBO.

Figure 9:
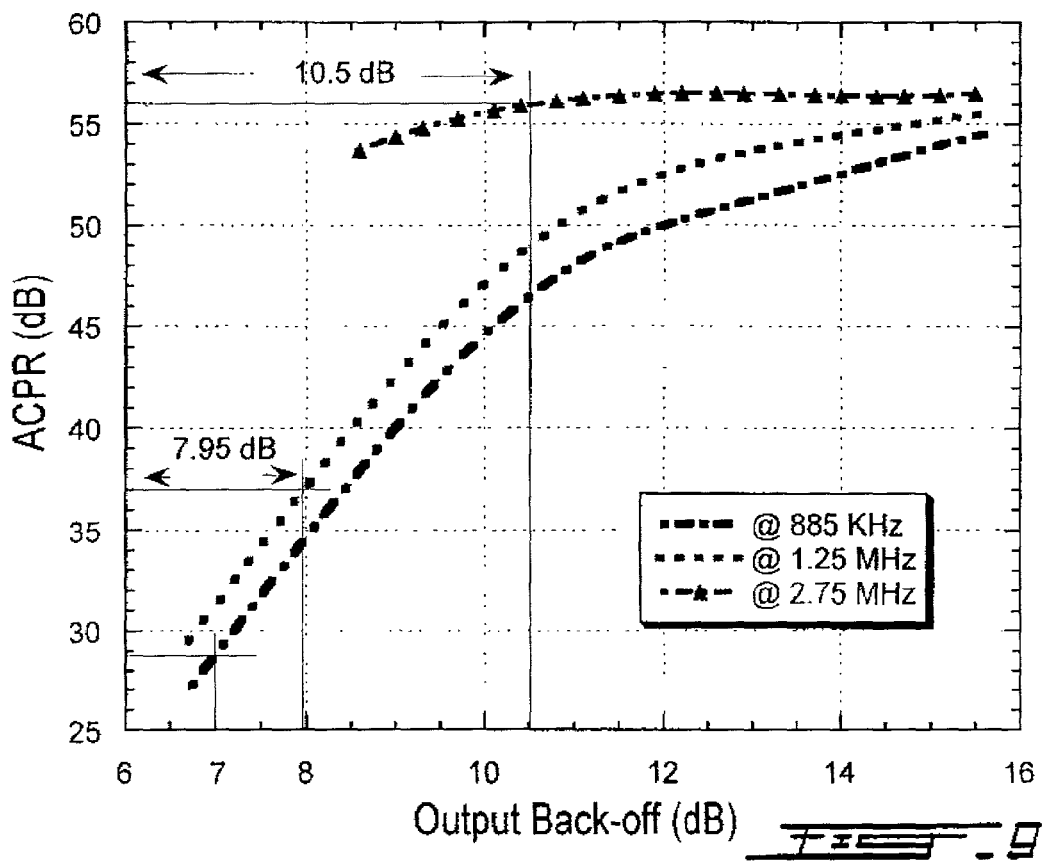
FIG. 9 is a graphic illustrating a simulation of ACPR vs OBO of a linearized 44 dBm PA under the stimulus of nine channels CDMA standard signal.

Now, considering the situation of the PA under the stimulus of the CDMA standard signal in FIG. 9, it is clear that more OBO is necessary to pass the spectrum emission mask. This is because now the spectral leakage includes both the clipping effect and the continuous nonlinearity effect of the PA. In this case, the standard requirement limits the PA operating point at least 8.2 dB at 885 kHz, 9.9 dB at 1.25 MHz, and 14.15 dB at 2.75 MHz.

Again, we can see that the third offset channel governs the minimum acceptable OBO and therefore, the PA cannot be operated with an OBO smaller than 14.15 dB. As expected, we can see by comparing results from FIGS. 7 and 9 that the PA needs 4.75 dB more in OBO than the minimum theoretical value given by the ideal limiter. On the other hand, it is the maximum amount in OBO reduction that can be theoretically achieved by predistortion for this PA.

Figure 10:
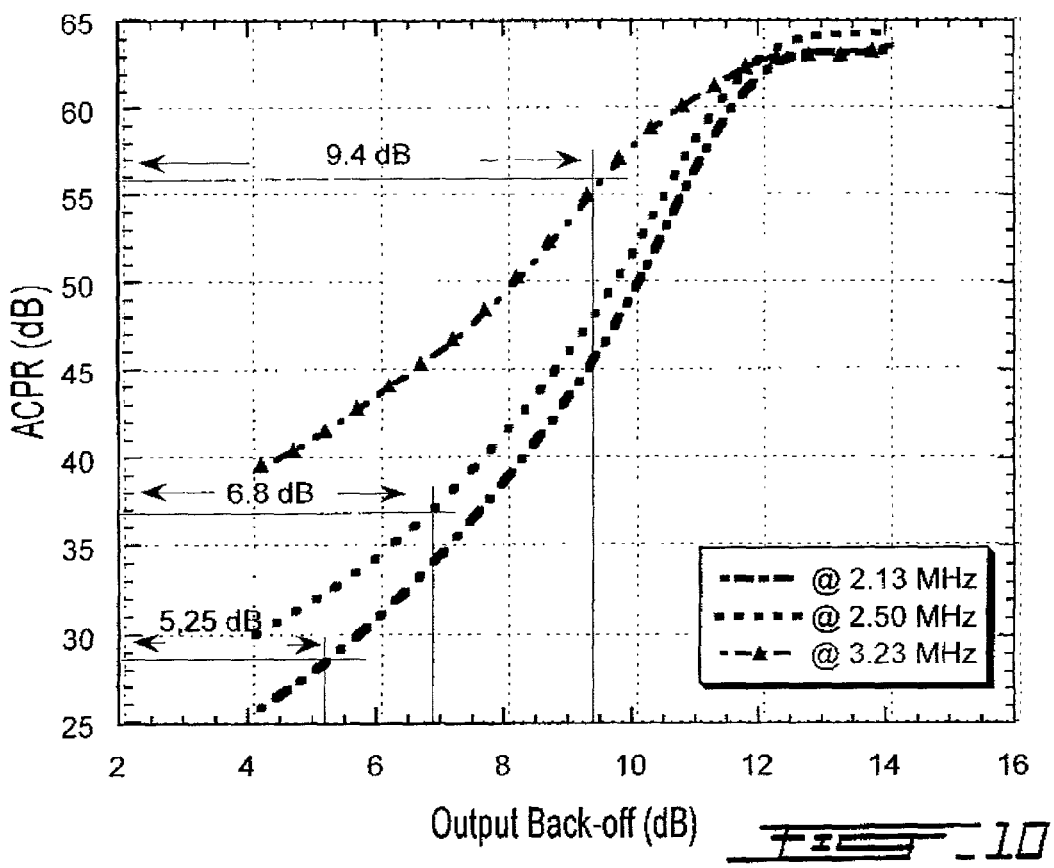
FIG. 10 is a graphic illustrating a simulation of ACPR vs OBO of the ideal limiter under the stimulus of a cdma2000 DS signal.

Under linearization effect, the plots in FIG. 10 show a minimum OBO of 7 dB at 885 kHz, 7.95 dB at 1.25 MHz and 10.5 dB at 2.75 MHz prevailing the value of 10.5 dB as the minimum acceptable OBO according to the spectrum emission mask. This result shows that the predistortion action from the linearizer diminish the OBO by 3.6 dB, it means 1 dB less than the maximum reduction in OBO that can be achieved theoretically. Notice that this difference is absorbed by the impairment from other components considered in the simulation.

The last set of simulation is performed for the same PA under W-CDMA standard signal including 11 channels as was described in section III-A.

Figure 11:
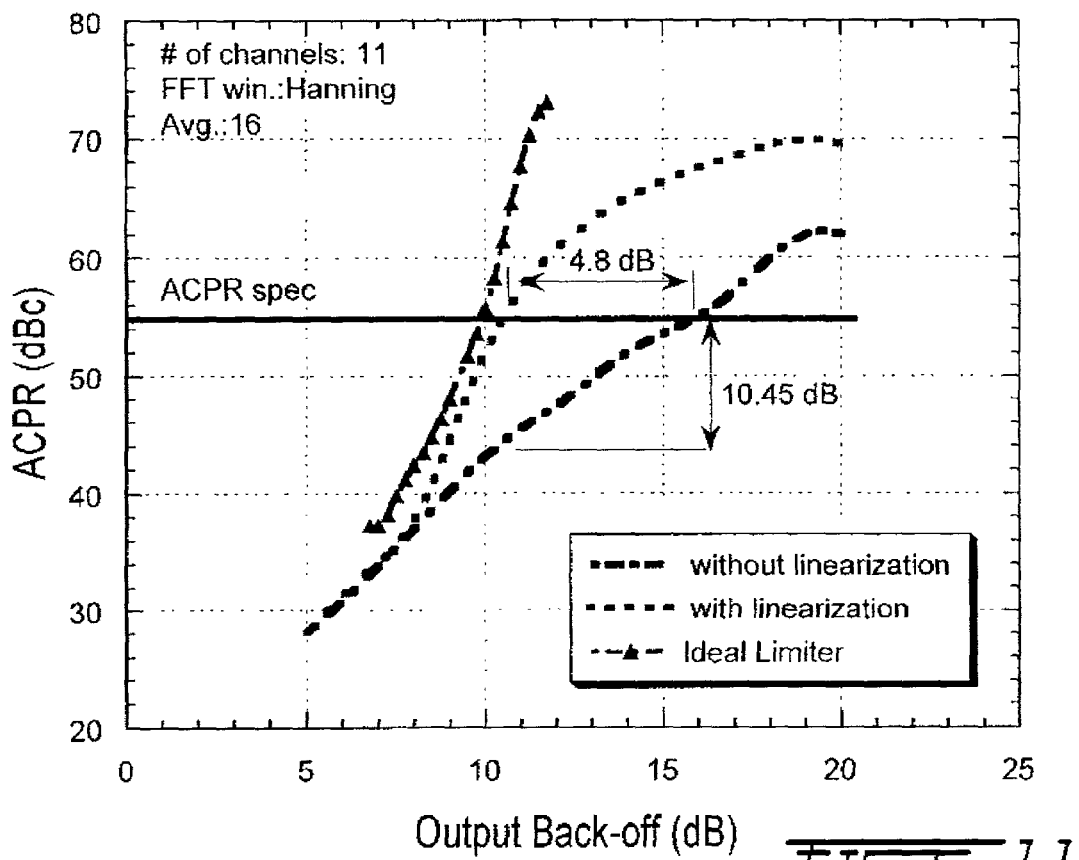
FIG. 11 is a graphic illustrating a simulation of ACPR vs OBO of both the ideal limiter and a 40 dBm PA under the stimulus of a W-CDMA standard signal.

FIG. 11 shows the ACPR simulation of the PA with and without linearization and including the ACPR plot of the ideal limiter, The plots reveal a reduction of 4.8 dB resulting a minimum acceptable OBO of 10.6 dB.

To estimate the performance of the linearizer under realistic condition, experimental results have been carried out in open loop condition for a 20 W class AB power amplifier operating at 1.96 GHz. In this case, the AM-AM and AM-PM transfer characteristics of the PA were measured by instantaneous characterization using a peak power analyzer for the first one, and a conventional measurement by network analyzer for the second one. Data from these measurements were used into the simulator to generate a long string of predistorted samples for W-CDMA standards signal including 11 channels. Then, these predistorted signals were fed into an arbitrary waveform generator to generate and supply a realistic predistorted signal to the PA.

Figure 12:
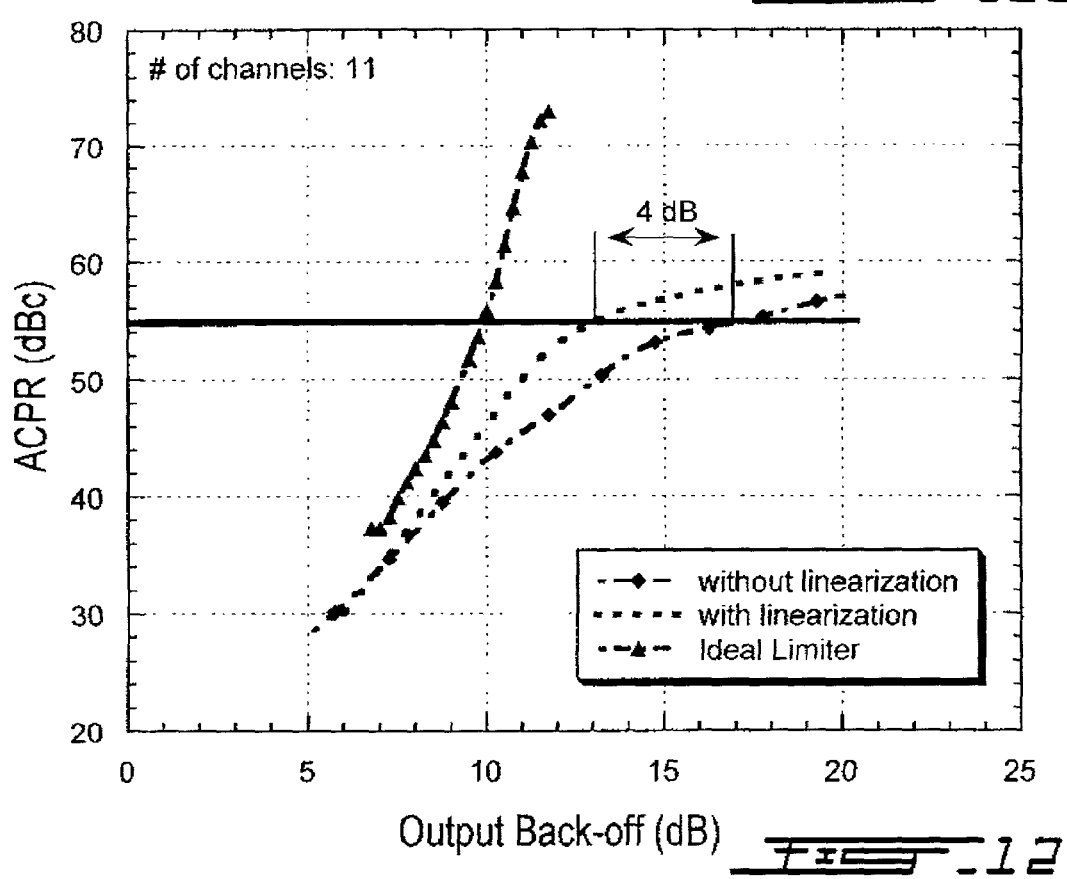
FIG. 12 is a graphic illustrating measurements of ACPR vs OBO of both the ideal limiter and a 40 dBm PA under the stimulus of a W-CDMA signal.

FIG. 12 shows the ACPR measurements of the PA with and without linearization; in addition, the ACPR simulation of the ideal limiter is included by aims of comparison. We can observe that the PA must be operated at least 17 dB OBO to meet the standard requirement, 1 dB more than the simulation result. Under linearization effect, the minimum acceptable OBO becomes about 13 dB allowing moving the operating point 4 dB toward the saturation region and giving an ACPR improvement of 5 dB. Notice that the lowest theoretical OBO performed by the ideal limiter is reached at 10 dB and still an improvement of 3 dB more in OBO reduction can be theoretically achieved. It means that the dynamic action of the adaptation step of the predistortion function and the instantaneous characterization which are supported by the digital receivers and the DSP environment, have an acceptable amount of room to improve the OBO reduction given under open loop condition. These results help us to predict the performance for the whole system with a minimum acceptable OBO of around 11 dB and with a predictable improvement of 6 dB in OBO reduction.

In summary, the improvement in OBO reduction is significant in the sense that in all cases the output power can be at least doubled with a resulting increase in power efficiency. It means that for the same linear output power, the OBO reduction allows the reduction of the absolute power rating of the PA. On the other hand, the improvement in OBO reduction is significant, i.e. around 5 dB.

Figure 13:
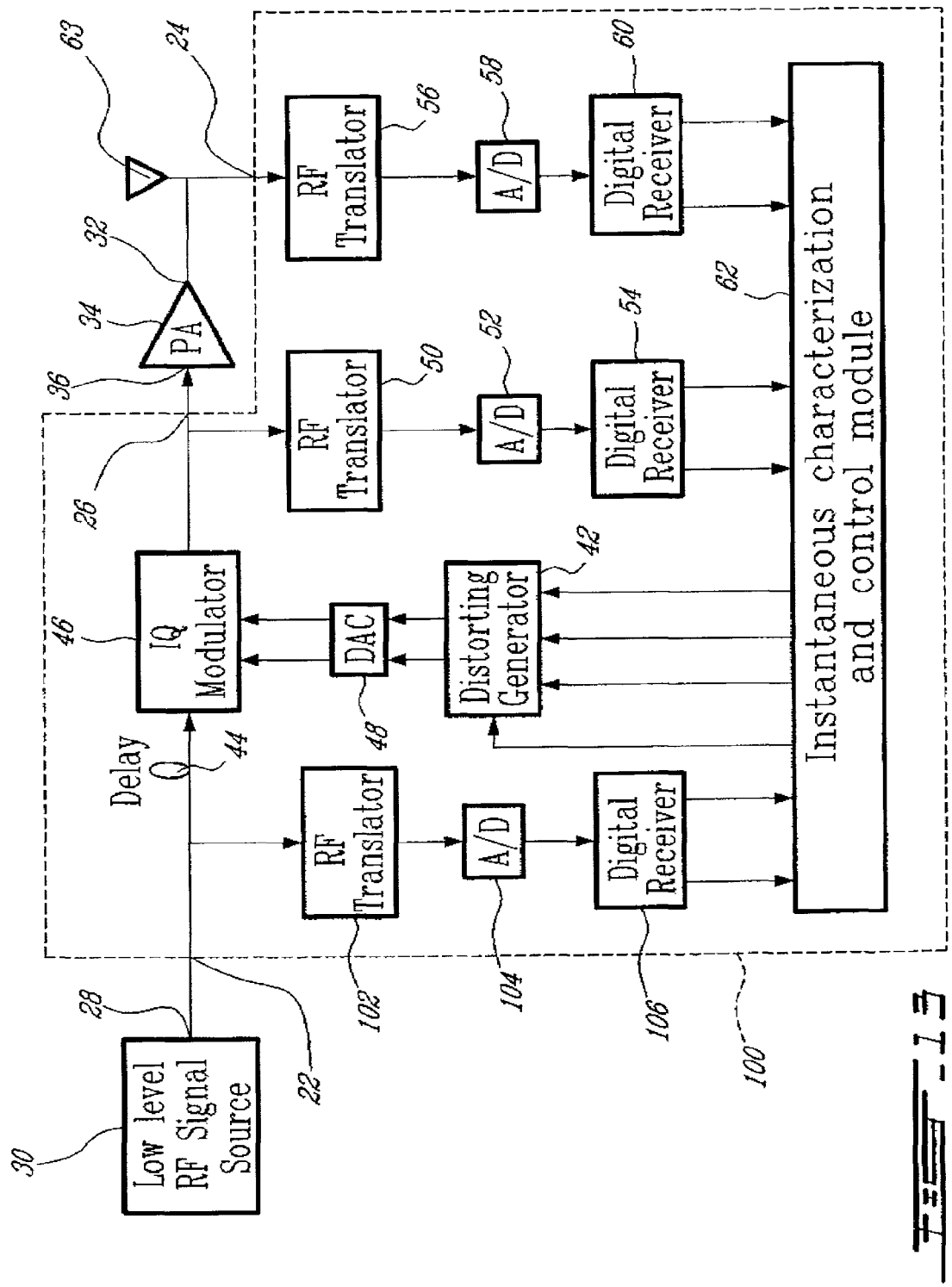
FIG. 13 is a general block diagram of a predistortion device according to a second embodiment of the present invention.

Turning now to FIG. 13 of the appended drawings, a predistorting device 100 according to a second embodiment of the present invention will be described. It is to be noted that the same reference numeral are used to refer to the same elements. It is also to be noted that the predistorting device 100 is very similar to the predistorting device 20 and therefore, for concision purposes, only the difference therebetween will be discussed hereinbelow.

Basically, the envelope detector 38 and the A/D converter 40 used to index the distorting generator 42 of the predistorting device 20 have been replaced by a third RF translator 102, A/D converter 104 and third digital receiver 106 route. The output of the digital receiver 106 is supplied to the instantaneous characterization and control module 62 which is used to index the distorting generator 42 as previously discussed. The other elements and the operation of the predistorting device 100 are identical to the predistorting device 20.

This predistorting device 100 is advantageous since the delay compensation between the delay line 44 an the digital path can be adjusted by software. In addition, this configuration gives the phase information of the input signal.

Figure 14:
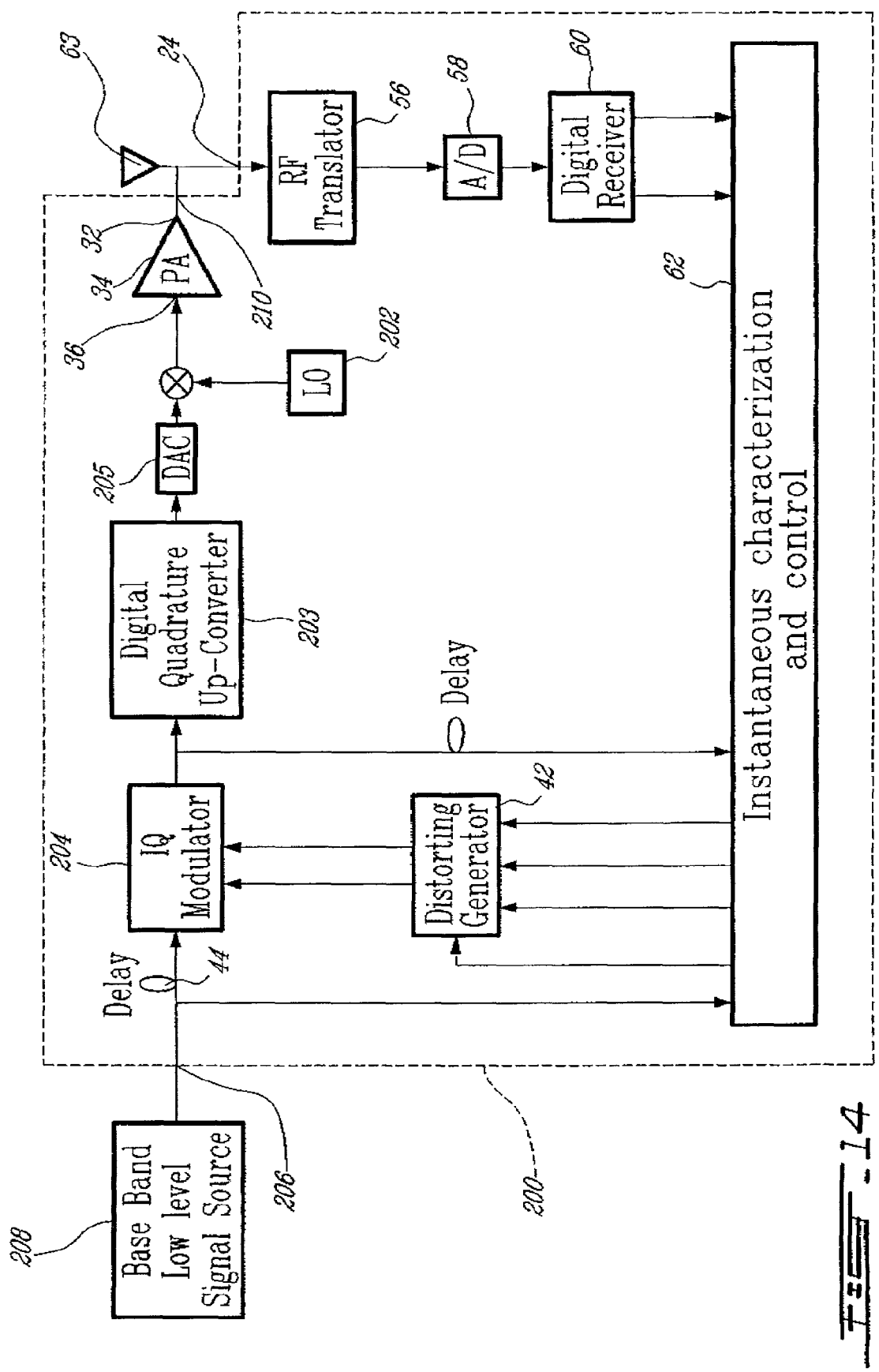
FIG. 14 is a general block diagram of an amplification system integrating a predistorting device according to the present invention.

Finally, FIG. 14 schematically illustrates a transmitter system 200 integrating a predistorting device similar to the predistorting device 100 of FIG. 13.

Since the signal is up-converted inside the transmitter system 200 by the combination of a local oscillator 202, a digital Quadrature Up-converter 203 and a DAC 205, only one RF translator 56 is required since it is the only path where a RF signal is picked up. Furthermore, since the predistortion is performed digitally in the baseband, a digital baseband IQ modulator 204 is used. The transmitter system 200 includes a baseband low level signal input 206 to which a baseband low level signal source 208 may be connected and a RF amplified signal output 210 to which an antenna 63 may be connected.

An adaptive basedband/RF predistorting device tracking the emerging technologies evolution of digital receivers was presented. The linearizer develops the algorithm of two digital receivers to execute an instantaneous characterization of the AM-AM and AM-PM non-linearities. The digital receivers allow a direct IQ demodulation in digital form from RF to baseband. Consequently, the disturbing effect of gain and phase imbalances of a RF analogue quadrature demodulator are completely avoided by directly processing the data with very high accuracy using analytical expressions. Additionally, the system can monitor the ACPR by processing simultaneous real time FFT spectra in different range of frequencies; it is accomplished by the advantage of the decimation process to perform a dramatic reduction in the signal bandwidth, RF/DSP co-simulation and experimental results have been carried out for evaluation purpose under different signals condition. Results reveal a significant reduction in effective output power back off (OBO) for the linearized power amplifier. Finally, the fact that the system can support different standard signals by tuning the values LO, M and R by software, this technique provides an attractive design suitable for mass production.

Although the present invention has been described hereinabove by way of preferred embodiments thereof, it can be modified, without departing from the spirit and nature of the subject invention as defined in the appended claims.

What is claimed is:

1. An adaptive method for predistorting an RF modulated signal, to be transmitted, supplied by a signal source to an input of a power amplifier having an output for delivering an amplified output signal, said method comprising the steps of:

predistorting the RF modulated signal to be transmitted using an I/Q modulator interposed between the signal source and the input of the power amplifier, and controlled by means of amplitude and phase look-up tables stored in a distorting generator;

producing, via a first digital receiver, a first feedback signal in response to the RF predistorted signal;

producing, via a second digital receiver, a second feedback signal in response to the RF amplified output signal from the power amplifier;

modeling the power amplifier in response to the first and second feedback signals; and updating the predistortion amplitude and phase look-up tables in response to said modeling of the power amplifier, wherein said second feedback signal includes the complex envelope of the RF amplified output signal, and wherein said modeling step includes the discrimination of the complex envelope of the first feedback signal referenced to the complex envelope of the second feedback signal to yield a predistortion function correlated to a behaviour of the power amplifier including nonlinearities and memory effects.

2. An adaptive method as recited in claim 1, wherein said modeling step is done in real time.

3. An adaptive method for predistorting an RF modulated signal, to be transmitted, supplied by a signal source to an input of a power amplifier having an output for delivering an amplified output signal, said method comprising the steps of:
- predistorting the RF modulated signal to be transmitted using an I/Q modulator interposed between the signal source and the input of the power amplifier, and controlled by means of amplitude and phase look-up tables stored in a distorting generator;
- producing, via a first digital receiver, a first feedback signal in response to the RF predistorted signal;
- producing, via a second digital receiver, a second feedback signal in response to the RF amplified output signal from the power amplifier;
- modeling the power amplifier in response to the first and second feedback signals; and
- updating the predistortion amplitude and phase look-up tables in response to said modeling of the power amplifier,
- wherein said updating step is done when a linearity metric adjacent channel power ratio (ACPR) measurement sub-step indicates that the predistorting step is not adequate to meet predetermined ACPR standards.

4. An adaptive method as recited in claim 3, wherein said linearity metric ACPR measurement sub-step is done via a digital receiver that includes a first channel tuned to a mean frequency and a second channel that is tuned to a predetermined offset frequency, said linearity metric ACPR measurement sub-step including comparing an average power at the mean frequency and at the predetermined offset frequency.

5. An adaptive device for predistorting an RF modulated signal to be transmitted, supplied by a signal source to an input of a power amplifier having an output for delivering an amplified output signal, said adaptive device comprising:
- an I/Q modulator interposed between the signal source and the input of the power amplifier;
- a distorting generator including predistortion amplitude and phase look-up tables; said distorting generator controlling said I/Q modulator to predistort the RF modulated signal to be transmitted in amplitude and in phase;
- a first digital receiver producing a first feedback signal in response to the RF predistorted signal from said I/Q modulator;
- a second digital receiver producing a second feedback signal in response to the RF amplified output signal from the power amplifier;
- a control module receiving said first and second feedback signals from said first and second digital receivers; said control module being so configured as to model the power amplifier in response to the first and second feedback signals and to update said amplitude and phase look-up tables of said distorting generator in response to a dynamic modeling of the power amplifier,
- wherein said look-up tables of said distorting generator are indexed by an envelope detector that detects the envelope of the signal to be transmitted before predistortion.

6. An adaptive device as recited in claim 5, wherein said envelope detector indexes the distorting generator via an analog to digital converter.

7. An adaptive device for predistorting an RF modulated signal to be transmitted, supplied by a signal source to an input of a power amplifier having an output for delivering an amplified output signal, said adaptive device comprising:
- an I/Q modulator interposed between the signal source and the input of the power amplifier;
- a distorting generator including predistortion amplitude and phase look-up tables; said distorting generator controlling said I/Q modulator to predistort the RF modulated signal to be transmitted in amplitude and in phase;
- a first digital receiver producing a first feedback signal in response to the RF predistorted signal from said I/Q modulator;
- a second digital receiver producing a second feedback signal in response to the RF amplified output signal from the power amplifier;
- a control module receiving said first and second feedback signals from said first and second digital receivers; said control module being so configured as to model the power amplifier in response to the first and second feedback signals and to update said amplitude and phase look-up tables of said distorting generator in response to a dynamic modeling of the power amplifier,
- wherein said look-up tables of said distorting generator are indexed by data from a third digital receiver that down-converts the signal to be transmitted to baseband.

8. An adaptive device as recited in claim 7, wherein the data from said third digital receiver is supplied to said control module that indexes said distorting generator accordingly.

9. An adaptive device for predistorting an RF modulated signal to be transmitted, supplied by a signal source to an input of a power amplifier having an output for delivering an amplified output signal, said adaptive device comprising:
- an I/Q modulator interposed between the signal source and the input of the power amplifier;
- a distorting generator including predistortion amplitude and phase look-up tables; said distorting generator controlling said I/Q modulator to predistort the RF modulated signal to be transmitted in amplitude and in phase;
- a first digital receiver producing a first feedback signal in response to the RF predistorted signal from said I/Q modulator;
- a second digital receiver producing a second feedback signal in response to the RF amplified output signal from the power amplifier;
- a control module receiving said first and second feedback signals from said first and second digital receivers; said control module being so configured as to model the power amplifier in response to the first and second feedback signals and to update said amplitude and phase look-up tables of said distorting generator in response to a dynamic modeling of the power amplifier,
- wherein said control module is so configured as to update said amplitude and phase look-up tables when an adjacent channel power ratio (ACPR) measurement indicates that the predistortion made by said predistorting generator is not adequate to meet predetermined ACPR standards.

10. An adaptive device as recited in claim 9, wherein said ACPR measurement is done via said second digital receiver that includes a first channel tuned to a mean frequency and a second channel that is tuned to a predetermined offset frequency, said ACPR measurement including comparing an average power at the means frequency and at the predetermined offset frequency.

11. An adaptive device for predistorting an RF modulated signal to be transmitted, supplied by a signal source to an input of a power amplifier having an output for delivering an amplified output signal, said adaptive device comprising:
   an I/Q modulator interposed between the signal source and the input of the power amplifier;
   a distorting generator including predistortion amplitude and phase look-up tables; said distorting generator controlling said I/Q modulator to predistort the RF modulated signal to be transmitted in amplitude and in phase;
   a first digital receiver producing a first feedback signal in response to the RF predistorted signal from said I/Q modulator;
   a second digital receiver producing a second feedback signal in response to the RF amplified output signal from the power amplifier;
   a control module receiving said first and second feedback signals from said first and second digital receivers; said control module being so configured as to model the power amplifier in response to the first and second feedback signals and to update said amplitude and phase look-up tables of said distorting generator in response to a dynamic modeling of the power amplifier,
   wherein said control module is further configured as to insert an adequate delay between the first feedback signal and the second feedback signal.

* * * * *